United States Patent
Chae et al.

(10) Patent No.: US 10,073,619 B2
(45) Date of Patent: Sep. 11, 2018

(54) INTERFACE CIRCUITS CONFIGURED TO INTERFACE WITH MULTI-RANK MEMORY

(71) Applicant: Samsung Electronics Co., Ltd., Suwon-si, Gyeonggi-do (KR)

(72) Inventors: Kwanyeob Chae, Hwaseong-si (KR); Yoonjee Nam, Daejeon (KR); Ji Hun Oh, Hwaseong-si (KR); Shinyoung Yi, Seoul (KR); Jong-Ryun Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/842,295

(22) Filed: Dec. 14, 2017

(65) Prior Publication Data

US 2018/0107387 A1    Apr. 19, 2018

Related U.S. Application Data

(63) Continuation of application No. 15/584,356, filed on May 2, 2017, now Pat. No. 9,857,973.

(30) Foreign Application Priority Data

Jul. 13, 2016    (KR) .................. 10-2016-0088684

(51) Int. Cl.
| | |
|---|---|
| *G06F 3/06* | (2006.01) |
| *G11C 7/10* | (2006.01) |
| *G11C 8/12* | (2006.01) |
| *G06F 13/40* | (2006.01) |
| *G11C 5/04* | (2006.01) |

(Continued)

(52) U.S. Cl.
CPC ........ *G06F 3/0601* (2013.01); *G06F 13/4072* (2013.01); *G11C 7/1078* (2013.01); *G11C 7/1093* (2013.01); *G11C 8/12* (2013.01); *G06F 3/0683* (2013.01); *G06F 12/0238* (2013.01); *G06F 13/1678* (2013.01); *G06F 13/1689* (2013.01); *G11C 5/04* (2013.01)

(58) Field of Classification Search
CPC .. G06F 3/0601; G06F 3/0683; G06F 12/0238; G06F 13/1678; G06F 13/1689; G06F 13/4072; G11C 5/04; G11C 7/1078; G11C 7/1093; G11C 8/12
See application file for complete search history.

(56) References Cited

U.S. PATENT DOCUMENTS

| | | | |
|---|---|---|---|
| 6,269,413 B1 | 7/2001 | Sherlock | |
| 6,286,076 B1 | 9/2001 | Schultz | |
| 7,039,144 B2 | 5/2006 | Chen et al. | |

(Continued)

FOREIGN PATENT DOCUMENTS

| | | |
|---|---|---|
| JP | 2006251931 A | 9/2006 |
| JP | 2007018266 A | 1/2007 |

(Continued)

*Primary Examiner* — Harry W Byrne
*Assistant Examiner* — R Lance Reidlinger
(74) *Attorney, Agent, or Firm* — Myers Bigel, P.A.

(57) ABSTRACT

An interface circuit may include a first FIFO circuit and a second FIFO circuit. The first FIFO circuit may generate first output data based on a first sampling signal and a second sampling signal. The second FIFO circuit may generate second output data based on a third sampling signal and a fourth sampling signal. The first FIFO circuit and the second FIFO circuit may be cross-reset.

20 Claims, 13 Drawing Sheets

(51) Int. Cl.
  *G06F 13/16* (2006.01)
  *G06F 12/02* (2006.01)

(56) References Cited

U.S. PATENT DOCUMENTS

| | | |
|---|---|---|
| 7,535,985 B2 | 5/2009 | Yuki et al. |
| 7,639,707 B2 | 12/2009 | Haywood |
| 7,724,606 B2 | 5/2010 | Osawa et al. |
| 8,327,043 B2 | 12/2012 | Yoshimura |
| 9,183,902 B2 | 11/2015 | Moon et al. |
| 9,530,472 B1 | 12/2016 | Park et al. |
| 9,558,840 B2 * | 1/2017 | Okuno .................. G11C 16/10 |
| 2014/0173228 A1 | 6/2014 | Lee et al. |

FOREIGN PATENT DOCUMENTS

| | | |
|---|---|---|
| JP | 4716001 B2 | 7/2011 |
| KR | 1020050014973 A | 2/2005 |

* cited by examiner

INTERFACE CIRCUITS CONFIGURED TO INTERFACE WITH MULTI-RANK MEMORY

CROSS-REFERENCE TO RELATED APPLICATIONS

This application is a continuation of U.S. patent application Ser. No. 15/584,356, filed May 2, 2017, which itself claims priority under 35 U.S.C. § 119 to Korean Patent Application No. 10-2016-0088684, filed Jul. 13, 2016 in the Korean Intellectual Property Office, the contents of which are hereby incorporated herein by reference in their entirety.

BACKGROUND

Embodiments of the inventive concepts disclosed herein relate to interface circuits and, more particularly, to interface circuits configured to interface with multi-rank memory.

Semiconductor memory devices may be classified into volatile memory devices and nonvolatile memory devices. Read and write speeds of volatile semiconductor memory devices may be fast, but data stored therein may disappear when a power supply voltage is interrupted. In contrast, even if the power supply voltage is interrupted, nonvolatile semiconductor memory devices may retain data stored therein. In particular, volatile memory devices such as a dynamic random access memory (DRAM) may have fast read and write speeds. Accordingly, DRAM or DRAM modules may be used as a data storage device, such as a solid state drive (SSD), or as main memory of a computing system.

As demand for a high-capacity memory increases, the use of multi-rank memory devices may increase. In multi-rank memory, however, since dies arranged for respective ranks may be different from each other, it may be difficult to calibrate skew of data read from multi-rank memory. One issue, in which the size of a valid window of the read data is reduced, may occur even when the skew of data read from the multi-rank memory may be adjustable. This may also cause a serious problem, such as a read fail. In addition, the high capacity of the multi-rank memory may cause an increase in the throughput of the interface circuit that performs interfacing with the multi-rank memory. Therefore, power consumption of the interface circuit may increase.

SUMMARY

Embodiments of the inventive concepts may provide interface circuits configured to interface with a multi-rank memory.

According to some embodiments of the inventive concepts, interface circuits are provided. An interface circuit may include a first FIFO circuit configured to generate pieces of first parallel data from a first sampling signal in response to a first edge of a first reference signal, generate pieces of second parallel data from a second sampling signal in response to a second edge of the first reference signal, and generate first output data from the pieces of first parallel data and the pieces of second parallel data in response to a first select signal that is generated based on a first division signal generated by dividing the first reference signal. The interface circuit may include a second FIFO circuit configured to generate pieces of third parallel data from a third sampling signal in response to a first edge of a second reference signal, generate pieces of fourth parallel data from a fourth sampling signal in response to a second edge of the second reference signal, and generate second output data from the pieces of third parallel data and the pieces of fourth parallel data in response to a second select signal that is generated based on a second division signal generated by dividing the second reference signal. The second FIFO circuit may be configured to be reset by the first division signal before the first output data is output from the first FIFO circuit. The first FIFO circuit may be configured to be reset by the second division signal before the second output data is output from the second FIFO circuit.

According to some embodiments of the inventive concepts, interface circuits are provided. An interface circuit may include a sampling circuit configured to generate a first sampling result and a second sampling result by sampling a logic state of a data signal in response to a first edge and a second edge of a data strobe signal, respectively. The interface circuit may include a delay circuit configured to delay the data strobe signal. The interface circuit may include a FIFO circuit configured to generate pieces of first parallel data from the first sampling result in response to a first edge of the delayed data strobe signal and generate pieces of second parallel data from the second sampling result in response to a second edge of the delayed data strobe signal. The FIFO circuit may be further configured to generate output data from the pieces of first parallel data and the pieces of second parallel data in response to a select signal generated according to the delayed data strobe signal. A frequency of the select signal may be lower than a frequency of the delayed data strobe signal.

According to some embodiments of the inventive concepts, interface circuits are provided. An interface circuit may include a first FIFO circuit configured to process pieces of first input data in a FIFO manner by using a first reference signal and divide the first reference signal to generate a first division signal. The interface circuit may include a second FIFO circuit configured to process pieces of second input data in the FIFO manner by using a second reference signal and divide the second reference signal to generate a second division signal. The second FIFO circuit may be configured to be reset by the first division signal before first output data is output from the first FIFO circuit. The first FIFO circuit may be configured to be reset by the second division signal before second output data is output from the second FIFO circuit.

According to some embodiments of the inventive concepts, interface circuits are provided. An interface circuit may include a first sampling circuit configured to generate first sampled data based on a first data signal in response to a first data strobe signal. The interface circuit may include a first divider circuit configured to divide the first data strobe signal to generate a first division signal. A frequency of the first division signal may be lower than a frequency of the first data strobe signal. The interface circuit may include a first front end FIFO circuit configured to store the first sampled data based on the first data strobe signal and further configured to generate first output data from the first sampled data in response to a first select signal. The first select signal may be generated based on the first division signal. A frequency of the first select signal may be lower than a frequency of the first data strobe signal. The interface circuit may include a back end FIFO circuit configured to store the first output data based on the first division signal.

BRIEF DESCRIPTION OF THE FIGURES

The above and other aspects and features of the embodiments of the inventive concepts will become more apparent in view of the attached drawings and accompanying detailed description.

DETAILED DESCRIPTION

Figure 1:
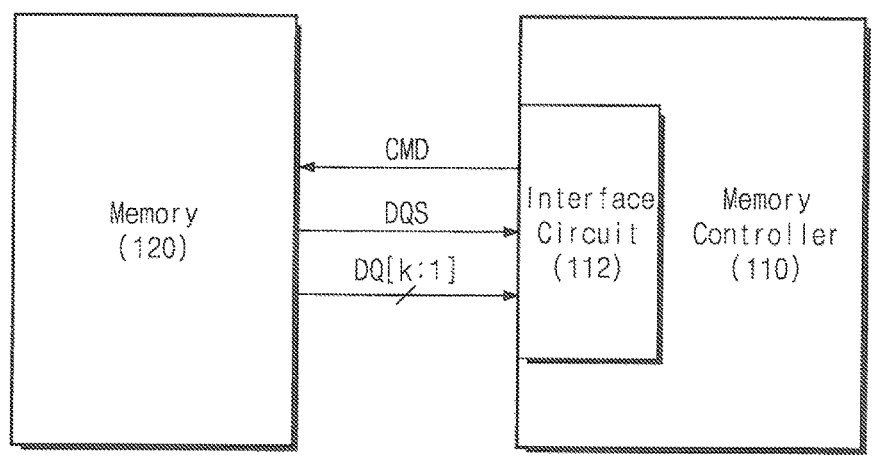
FIG. 1 is a block diagram schematically illustrating a memory device according to some embodiments of the inventive concepts.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "connected to" or "on" another element, it can be directly connected to or on the other element or intervening elements may be present. In contrast, the term "directly" means that there are no intervening elements. Additionally, embodiments that are described in the detailed description may be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Embodiments of the present inventive concepts explained and illustrated herein may include their complementary counterparts. The same reference numerals or the same reference designators denote the same elements throughout the specification.

FIG. 1 is a block diagram schematically illustrating a memory device according to some embodiments of the inventive concepts. Referring to FIG. 1, a memory device 100 may include a memory controller 110 and a memory 120.

The memory controller 110 may include an interface circuit 112 to interface with the memory 120. If the memory controller 110 receives a read request from a host, the memory controller 110 may provide the read command CMD to the memory 120. A data signal DQ, which may be read from the memory 120 in response to the read command CMD, and a data strobe signal DQS may be provided to the interface circuit 112. For example, the interface circuit 112 may receive a plurality of data signals DQ[k:1] through a plurality of input/output lines. For example, the interface circuit 112 may be a read interface circuit configured to read data from the memory 120.

The interface circuit 112 may include a physical block that operates at a frequency that is different from a frequency of the data strobe signal DQS. For example, the interface circuit 112 may include multi-stage first-in first-out (FIFO) circuits. The FIFO circuits may operate at different frequencies. For example, a FIFO circuit that is arranged at a front stage of the interface circuit 112 may operate at a relatively high frequency and may have a small capacity or a shallow depth. In contrast, a FIFO circuit that is arranged at a rear stage of the interface circuit 112 may operate at a relatively low frequency and may have a larger capacity or a deep depth.

Power consumption of the FIFO circuit that is arranged at the rear stage of the interface circuit 112 and may have a relatively large capacity, may have a great influence on power consumption of the interface circuit 112 implemented in the multi-stage form. However, according to some embodiments, the interface circuit 112 may be configured such that the FIFO circuit that is arranged at the rear stage of the interface circuit 112 operates at a relatively low frequency, thereby reducing power consumption of the interface circuit 112.

The memory 120 may be a volatile memory. For example, the memory 120 may include DRAM cells and may be implemented with a memory module. In some embodiments, the memory module may be a dual in-line memory module (DIMM) and may be composed of a plurality of ranks. For example, the memory module may be implemented with a single in-line memory module (SIMM), a DIMM, a small-outline DIMM (SO-DIMM), an un-buffered DIMM (UDIMM), a fully-buffered DIMM (FBDIMM), a rank-buffered DIMM (RBDIMM), a load-reduced DIMM (LRDIMM), a mini-DIMM, a micro-DIMM, etc.

Figure 2:
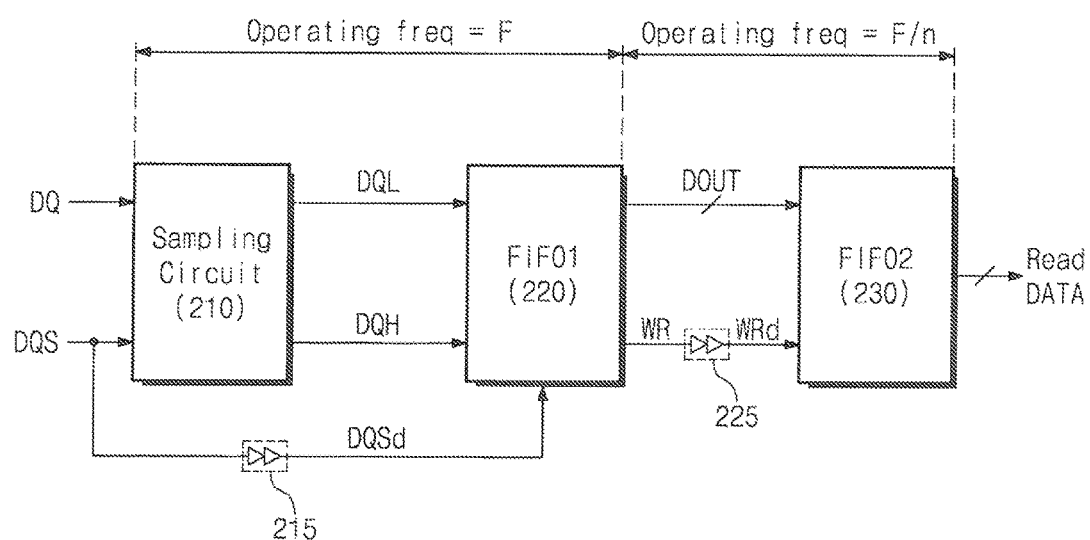
FIG. 2 is a block diagram schematically illustrating an interface circuit illustrated in FIG. 1 in detail according to some embodiments of the inventive concepts.

FIG. 2 is a block diagram schematically illustrating the interface circuit illustrated in FIG. 1 in detail according to some embodiments of the inventive concepts. An interface circuit 200 may include a sampling circuit 210, a first FIFO circuit 220, and a second FIFO circuit 230. The interface circuit 200 may further include a first delay chain 215 that delays the data strobe signal DQS and a second delay chain 225 that delays a signal WR generated based on the delayed data strobe signal DQSd.

The sampling circuit 210 may capture a logic state (e.g., "0" or "1") of the data signal DQ read from the memory 120 (refer to FIG. 1) in response to the data strobe signal DQS and may hold the captured logic state. The above-described operations may be referred to as a "latch". For example, the sampling circuit 210 may generate first read data DQL (or a first sampling result) latched at a first edge (e.g., a rising edge) of the data strobe signal DQS. For example, the first read data DQL may include odd-numbered pieces of data among pieces of data constituting a data signal. As in that described above, the sampling circuit 210 may generate second read data DQH (or a second sampling result) latched at a second edge (e.g., a falling edge) of the data strobe signal DQS. For example, the second read data DQH may include even-numbered pieces of data among the pieces of data constituting the data signal.

The first delay chain 215 may generate the delayed data strobe signal DQSd by delaying the data strobe signal DQS. Various configurations may be used to delay the data strobe signal DQS. However, such configurations may be well known, and a detailed description thereof may be thus omitted.

The first FIFO circuit 220 may store the first read data DQL and the second read data DQH by using the delayed data strobe signal DQSd. In some embodiments, the delayed data strobe signal DQSd and the data strobe signal DQS may have the same frequency of "F". For example, the first FIFO circuit 220 may latch the first read data DQL at the first edge (e.g., the rising edge) of the delayed data strobe signal DQSd. The latched result, that is, pieces of parallel data generated from the first read data DQL may be stored in the first FIFO circuit 220. As in that described above, the first FIFO circuit 220 may latch the second read data DQH at the second edge (e.g., the falling edge) of the delayed data strobe signal DQSd. The latched result, that is, pieces of parallel data generated from the first read data DQH may be stored in the first FIFO circuit 220.

The first FIFO circuit 220 may generate a signal WR by dividing the delayed data strobe signal DQSd. A frequency of the signal WR may be lower than a frequency of the data strobe signal DQS or the delayed data strobe signal DQSd. The first FIFO circuit 220 may generate parallel output data DOUT by using the first read data DQL and the second read data DQH. For example, the output data DOUT may be parallel data that is output in units of 2n bits. Here, "n" may be a value obtained by dividing a frequency of the delayed data strobe signal DQSd by a frequency of the signal WR, that is, a division ratio. The signal WR and the output data DOUT that are generated by the first FIFO circuit 220 may be provided to the second FIFO circuit 230.

The second delay chain 225 may generate the delayed signal WRd by delaying the signal WR. A configuration and a function of the second delay chain 225 may be similar to those of the first delay chain 215, and a duplicated description may be thus omitted.

The second FIFO circuit 230 may store the output data DOUT by using the delayed signal WRd. For example, the second FIFO circuit 230 may latch the output data DOUT at the first edge (e.g., the rising edge) or the second edge (e.g., the falling edge) of the delayed signal WR. For example, a capacity of the second FIFO circuit 230 may be greater than a capacity of the first FIFO circuit 220 and/or a depth of the second FIFO circuit 230 may be deeper than a depth of the first FIFO circuit 220.

For example, since the second FIFO circuit 230 is arranged at the rear stage of the interface circuit 200 to output read data, a capacity of the second FIFO circuit 230 may not only be greater than that of the first FIFO circuit 220, but a depth thereof may also be deeper than the first FIFO circuit 220. This means that the second FIFO circuit 230 may have a considerable influence on power consumption of the interface circuit 200. As such, the interface circuit 200 may be implemented with multi-stage FIFO circuits. In particular, the interface circuit 200 may be configured such that a FIFO circuit arranged at the rear stage of the interface circuit 200 operates at a relatively low frequency, thereby reducing power consumption of the interface circuit 200.

Figure 3:
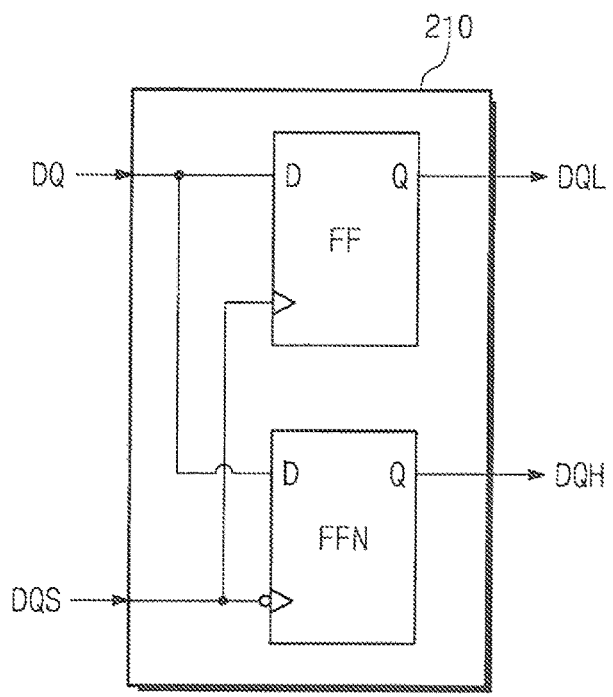
FIG. 3 is a block diagram schematically illustrating an exemplary configuration of the sampling circuit illustrated in FIG. 2 according to some embodiments of the inventive concepts.
Figure 4:
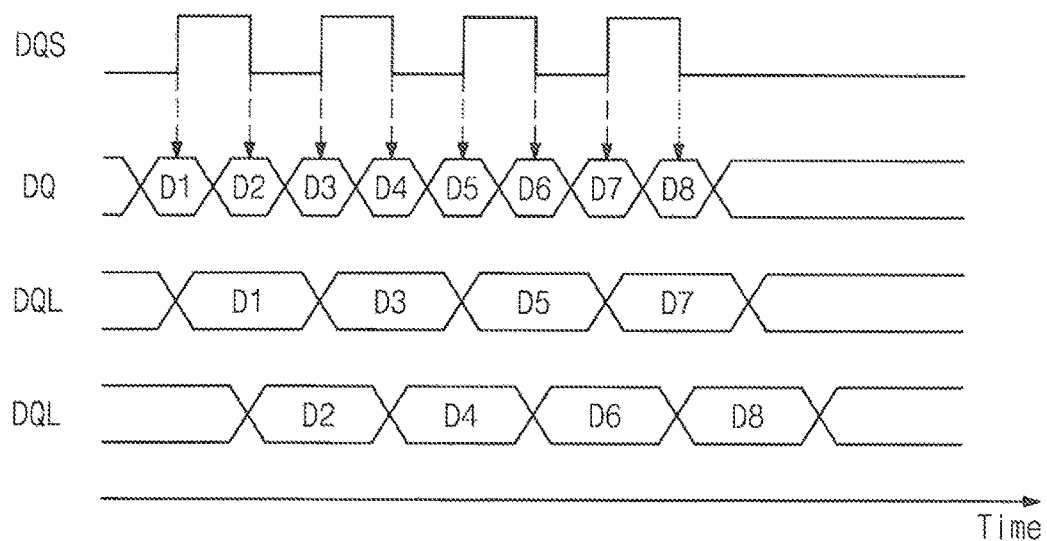
FIG. 4 is a timing diagram illustrating an operation of the sampling circuit illustrated in FIG. 3 according to some embodiments of the inventive concepts.

FIG. 3 is a block diagram schematically illustrating an exemplary configuration of the sampling circuit illustrated in FIG. 2 according to some embodiments of the inventive concepts. The sampling circuit 210 may include a first flip-flop FF and a second flip-flop FFN. FIG. 4 is a timing diagram illustrating an operation of the sampling circuit illustrated in FIG. 3 according to some embodiments of the inventive concepts. For better understanding, an operation of the sampling circuit 210 will be described with reference to FIGS. 3 and 4.

The first flip-flop FF may capture and hold a logic level of a data signal DQ input to an input terminal D thereof in response to a first edge (e.g., rising edge) of the data strobe signal DQS. The first read data DQL may be generated as a result of the latch operation. For example, the first read data DQL may include odd-numbered pieces of data D1, D3, D5, and D7 among pieces of data constituting the data signal DQ. The first flip-flop FF is illustrated in FIG. 3 as being an edge-triggered D flip-flop. However, embodiments are not limited thereto.

The second flip-flop FFN may capture and hold a logic level of the data signal DQ input to an input terminal D thereof in response to a second edge (e.g., falling edge) of the data strobe signal DQS. The second read data DQH may be generated as a result of the latch operation. For example, the second read data DQH may include even-numbered pieces of data D2, D4, D6, and D8 among the pieces of data constituting the data signal DQ. The second flip-flop FFN is illustrated in FIG. 3 as being an edge-triggered D flip-flop. However, embodiments are not limited thereto.

The first read data DQL and the second read data DQH may be respectively output from an output terminal Q of the first flip-flop FF and an output terminal Q of the second flip-flop FFN based on a latch order thereof. For example, the first read data DQL and the second read data DQH may be provided to the second FIFO circuit 230 after being processed by the first FIFO circuit 220 in the FIFO manner.

Figure 5:
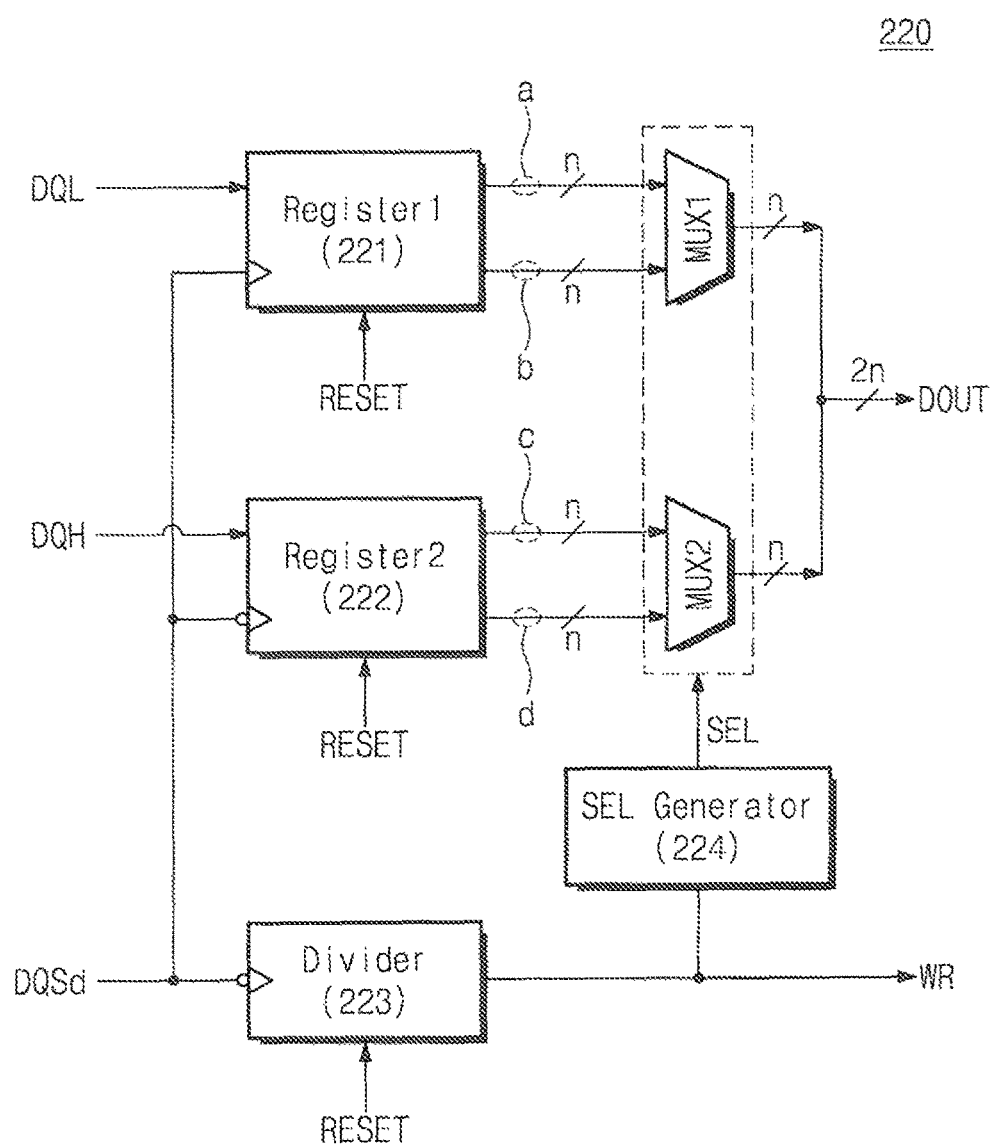
FIG. 5 is a block diagram schematically illustrating an exemplary configuration of the first FIFO circuit illustrated in FIG. 2 according to some embodiments of the inventive concepts.
Figure 6:
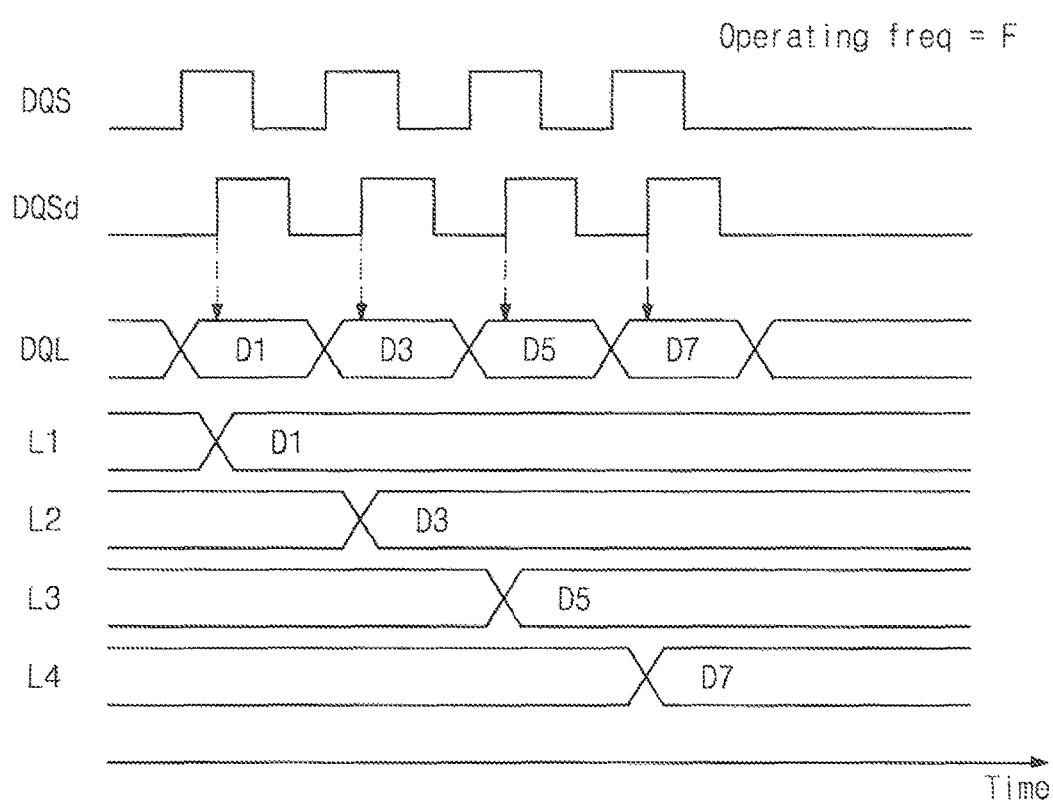
FIG. 6 is a timing diagram illustrating an operation of the first register illustrated in FIG. 5 according to some embodiments of the inventive concepts.
Figure 7:
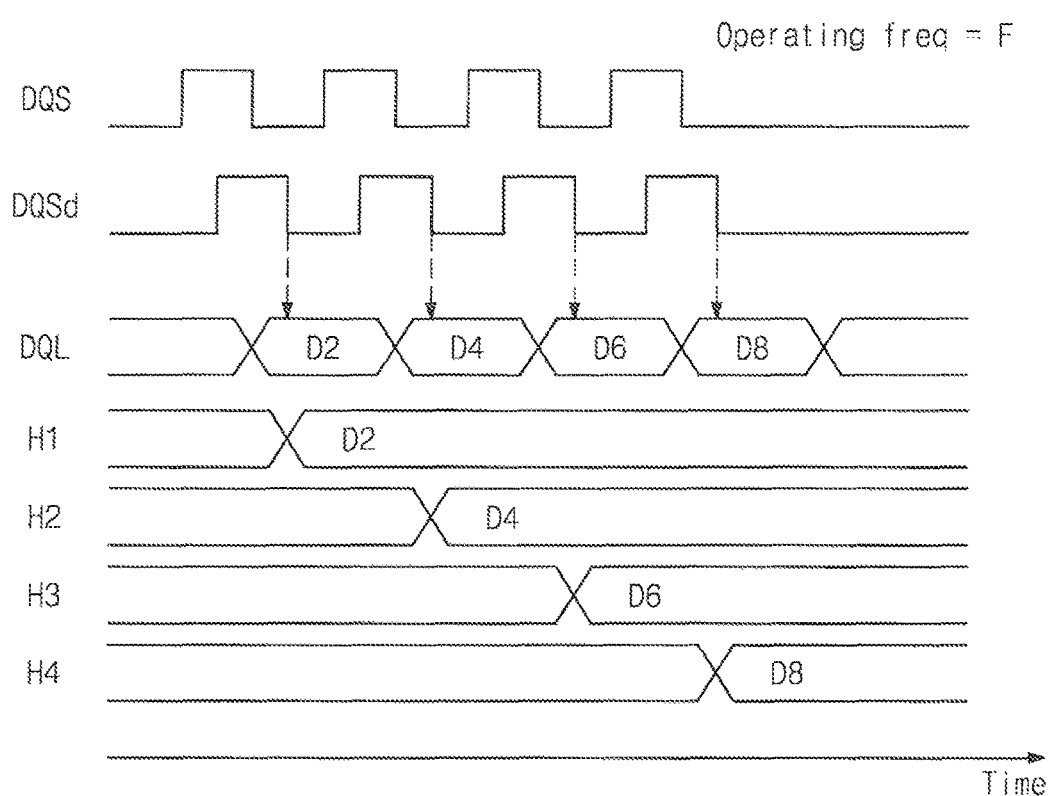
FIG. 7 is a timing diagram illustrating an operation of the second register illustrated in FIG. 5 according to some embodiments of the inventive concepts.

FIG. 5 is a block diagram schematically illustrating an exemplary configuration of the first FIFO circuit illustrated in FIG. 2 according to some embodiments of the inventive concepts. FIG. 6 is a timing diagram illustrating an operation of a first register illustrated in FIG. 5 according to some embodiments of the inventive concepts. FIG. 7 is a timing diagram illustrating an operation of a second register illustrated in FIG. 5 according to some embodiments of the inventive concepts. The first FIFO circuit 220 illustrated in FIG. 5 may include a first register 221, a second register 222, a divider 223, a select signal generator 224, a first multiplexer MUX1, and a second multiplexer MUX2.

An operation of the first register 221 will be described with reference to FIGS. 5 and 6. The first register 221 may latch the first read data DQL in response to the delayed data strobe signal DQSd. For example, the first register 221 may generate parallel data L1 to L4 by latching the first read data DQL at first edges (e.g., rising edges) of the delayed data strobe signal DQSd, respectively. As illustrated in FIG. 6, the parallel data L1 may be generated by latching first data D1 of the first read data DQL at the rising edge of a first pulse of the delayed data strobe signal DQSd. The remaining parallel data L2 to L4 may be generated in a method that is the same as or similar to that described above.

The first register 221 may output the generated parallel data L1 to L4 to the first multiplexer MUX1. In some embodiments, the parallel data L1 to L4 may be output to the first multiplexer MUX1 after being grouped. For example, each group may include pieces of parallel data of which the number is the same as a division ratio "n" of the divider 223. Here, the division ratio "n" may be a value obtained by dividing a frequency of the delayed data strobe signal DQSd by a frequency of the signal WR.

For example, the division ratio "n" of the divider 223 may be "2". In some embodiments, the parallel data L1 to L4 may be classified into a plurality of groups, each of which may include two parallel data. The groups may be sequentially output to the first multiplexer MUX1. For example, the data L1 and L2, which are first output from the first register 221, from among the data L1 to L4 may be provided to the first multiplexer MUX1 through a plurality of lines "a". The data L3 and L4, which are later output from the first register 221, from among the data L1 to IA may be provided to the first multiplexer MUX1 through a plurality of lines "b". Afterwards, selection may be made by the first multiplexer MUX1, which will be more fully described with reference to FIG. 8.

An operation of the second register 222 will be described with reference to FIGS. 5 and 7. The second register 222 may latch the second read data DQL in response to the delayed data strobe signal DQSd. For example, the second register 222 may generate parallel data H1 to H4 by latching the first read data DQL at second edges (e.g., falling edges) of the delayed data strobe signal DQSd, respectively. As illustrated in FIG. 7, the parallel data H1 may be generated by latching first data D1 of the second read data DQH at the falling edge of the first pulse of the delayed data strobe signal DQSd. The remaining parallel data H2 to H14 may be generated in a method that is the same as or similar to that described above.

The second register 222 may output the generated parallel data H1 to H4 to the second multiplexer MUX2. In some embodiments, the parallel data H1 to H4 may be output to the second multiplexer MUX2 after being grouped. For example, each group may include pieces of parallel data of which the number is the same as the division ratio "n" of the divider 223. As in that described above, if the division ratio "n" of the divider 223 is "2", the parallel data H1 and H4 may be classified into two groups such that each group includes two parallel data.

The data H1 and H2, which are first output from the second register 222, from among the data H1 to L4 may be provided to the second multiplexer MUX2 through a plurality of lines "c". The data H3 and H4, which are later output from the second register 222, from among the data H1 to L4 may be provided to the second multiplexer MUX2 through a plurality of lines "d". Afterwards, selection may be made by the second multiplexer MUX2, which will be more fully described with reference to FIG. 8.

The latch operations of the first register 221 and second register 222 may be performed by using the delayed data strobe signal DQSd having a frequency of "F". The first register 221 and the second register 222 may be reset by a reset signal RESET. A separate component that generates the reset signal RESET may be further included in the first FIFO circuit 220. However, the component may be well known, and a detailed description thereof may be thus omitted.

Figure 8:
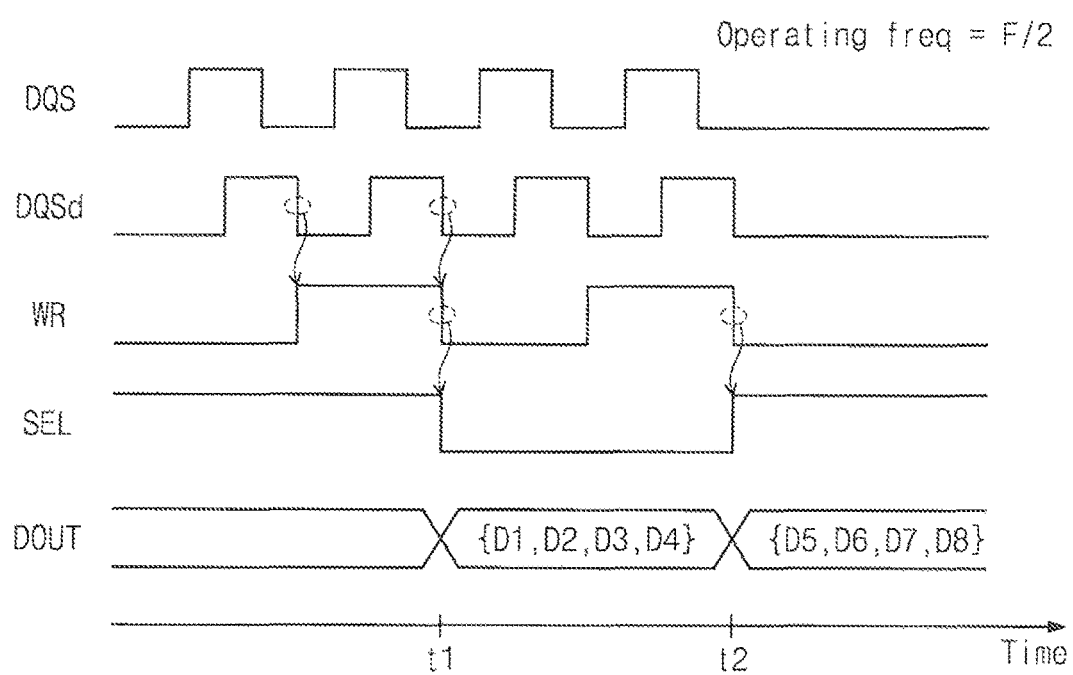
FIG. 8 is a timing diagram illustrating an operation of the first and second multiplexers illustrated in FIG. 5 according to some embodiments of the inventive concepts.

FIG. 8 is a timing diagram illustrating an operation of the first and second multiplexers illustrated in FIG. 5 according to some embodiments of the inventive concepts. Operations of the divider 223, the select signal generator 224, the first multiplexer MUX1, and the second multiplexer MUX2 will be described with reference to FIGS. 5 and 8.

The divider 223 may generate the signal WR by dividing the delayed data strobe signal DQSd. For example, a value that is obtained by dividing a frequency of the delayed data strobe signal DQSd by a frequency of the signal WR may be "n". A division ratio "n" of "2" will be discussed herein. However, inventive concepts are not limited thereto. In some embodiments, the divider 223 may invert a phase of the delayed data strobe signal DQSd to generate the signal WR. A frequency of the signal WR thus generated may be two times a frequency of the delayed data strobe signal DQSd. To generate the signal WR, the divider 223 may be implemented with a combination of various logic elements. However, a detailed configuration of the divider 223 may be well known, and a description thereof may be thus omitted. The divider 223 may be reset by the reset signal RESET.

The select signal generator 224 may generate a select signal SEL by using the signal WR. For example, in some embodiments, as illustrated in FIG. 8, the select signal SEL may be a signal that has falling and rising edges corresponding to two adjacent falling edges of the signal WR, respectively. In some embodiments, when the division ratio 'n" of the divider 223 is "2", an interval between the falling edge and the rising edge of the select signal SEL may correspond to two times a period of the data strobe signal DQS. To generate the select signal WR, the select signal generator 224 may be implemented with a combination of various logic elements. However, a detailed configuration of the select signal generator 224 may be well known, and a description thereof may be thus omitted. In some embodiments, the select signal generator 224 may be reset by the reset signal RESET.

As illustrated in FIG. 5, the select signal generator 224 may generate the select signal SEL based on the signal WR. However, in some embodiments, the select signal SEL may be generated based on a signal (e.g., DQS or DQSd) different from the signal WR. Alternatively, in some embodiments, the first FIFO circuit 220 may further include a separate select signal generator that generates the select signal SEL.

The first multiplexer MUX1 may select any one of two groups of parallel data received from the first register 221 in response to a first edge (e.g., falling edge) of the select signal SEL. As described above, a first group of parallel data L1 and L2 (refer to FIG. 6) may be received through the lines "a", and a second group of parallel data L3 and L4 (refer to FIG. 6) may be received through the lines "b".

At the same time, the second multiplexer MUX2 may select any one of two groups of parallel data received from the second register 222 in response to the first edge (e.g., the falling edge) of the select signal SEL. As described above, a first group of parallel data H1 and H2 (refer to FIG. 7) may be received through the lines "c", and a second group of parallel data H3 and H4 (refer to FIG. 7) may be received through the lines "d".

Through the selection operations of the first and second multiplexers MUX1 and MUX2, the parallel data D1, D2, D3, and D4 may be output as the output data DOUT during a time period (i.e., t1 to t2) between a first edge and a second edge of the select signal SEL.

Afterwards, the first multiplexer MUX1 may select the other of two groups of parallel data received from the first register 221 in response to the second edge (e.g., rising edge) of the select signal SEL. Since the first group of parallel data is previously selected by the first multiplexer MUX1, a second group of parallel data may be selected at the second edge of the select signal SEL. The second group of parallel data L3 and L4 (refer to FIG. 6) may be received through the lines "b".

At the same time, the second multiplexer MUX2 may select the other of two groups of parallel data received from the second register 222 in response to the second edge (e.g., the rising edge) of the select signal SEL. Since the first group of parallel data is previously selected by the second multiplexer MUX2, a second group of parallel data may be selected at the second edge of the select signal SEL. The second group of parallel data H3 and H4 (refer to FIG. 7) may be received through the lines "d".

Through the selection operations of the first and second multiplexers MUX1 and MUX2, the parallel data D5, D6, D7, and D8 may be output as the output data DOUT during a time period (i.e., a time period after t2) after the second edge of the select signal SEL.

In some embodiments, the first multiplexer MUX1 and the second multiplexer MUX2 may be used to select parallel data from the first register 221 and second register 222. However, a configuration for selecting parallel data is not limited thereto. For example, a switch circuit implemented with various logic elements may be used to select parallel data.

With the above-described configuration, the output data DOUT from the first FIFO circuit 220 may be stored in the second FIFO circuit 230 by using the signal WR of which the frequency is half a frequency of the data strobe signal DQS. An example in which the division ratio of the divider 223 is "2" is described. However, if the division ratio of the divider 223 is "n", the output data DOUT from the first FIFO circuit 220 may be stored in the second FIFO circuit 230 by using the signal WR of which the frequency is 1/n times a frequency of the data strobe signal DQS. That is, the second FIFO circuit 230, which may occupy a considerable portion of the interface circuit 112 (refer to FIG. 1), may operate at a relatively low frequency, thereby reducing power consumption of the interface circuit 112.

Figure 9:
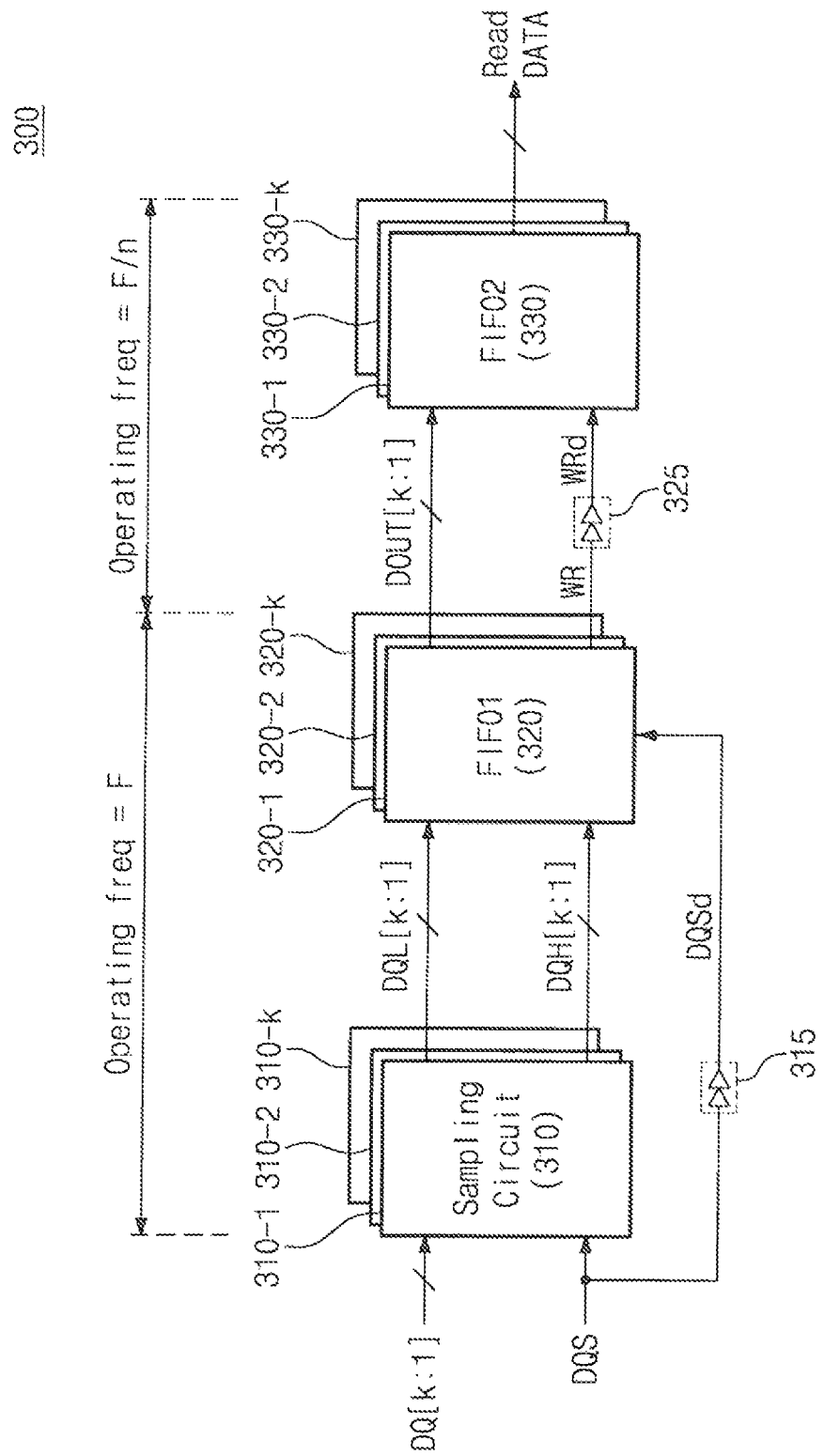
FIG. 9 is a block diagram schematically illustrating the interface circuit illustrated in FIG. 1 in detail according to some embodiments of the inventive concepts.

FIG. 9 is a block diagram schematically illustrating the interface circuit illustrated in FIG. 1 in detail according to some embodiments of the inventive concepts. A configuration and a function of an interface circuit 300 may be substantially the same as or similar to those of the above-described interface circuit 200, and therefore a duplicated description thereof may be thus omitted. For better understanding, a description will be given with reference to FIGS. 1 and 9.

The interface circuit 300 may include respective pluralities of sampling circuits 310, first FIFO circuits 320, and second FIFO circuits 330. The interface circuit 300 may further include a first delay chain 315 that delays the data strobe signal DQS and a second delay chain 325 that delays the signal WR generated based on the delayed data strobe signal DQSd.

The sampling circuits 310 may include a sampling circuit 310-1 to a sampling circuit 310-$k$. The sampling circuits 310 may receive a plurality of data signals DQ[k:1]. For example, "k" may have various values based on a rule of a double data rate (DDR) specification. Each sampling circuit may generate first read data DQL and second read data DQH by latching the data signal DQ. As described with reference to FIG. 4, the first read data DQL may include odd-numbered pieces of data (e.g., D1, D3, D5, and D7) among pieces of data constituting the data signal DQ, and the second read data DQH may include even-numbered pieces of data (e.g., D2, D4, D6, and D8) among the pieces of data constituting the data signal DQ. Each read data DQL or DQH may be output to the first FIFO circuits 320 in units of k bits.

The first FIFO circuits 320 may include a first FIFO circuit 320-1 to a first FIFO circuit 320-$k$. The first FIFO circuits 320 may generate pieces of output data DOUT by using the pieces of first read data DQL and the pieces of second read data DQH. Each of the first FIFO circuits 320 may have a configuration and a function that are substantially the same as or similar to those of the first FIFO circuit 220 described with reference to FIG. 2. Operations of the first FIFO circuits 320 are in detail described above, and thus a repeated description thereof may be omitted. The output data DOUT may be output in units of (k×2n) bits.

The second FIFO circuits 330 may include a second FIFO circuit 330-1 to a second FIFO circuit 330-$k$. The second FIFO circuits 330 may store the pieces of output data DOUT in response to the signal WR delayed by the second delay chain 325. The pieces of output data DOUT may be stored in the second FIFO circuits 330 by using the signal WR of which the frequency is 1/n times a frequency of the delayed data strobe signal DQSd. Therefore, it may be possible to reduce power consumption of the second FIFO circuits 330 that occupy a considerable portion of the interface circuit 300.

The pieces of output data DOUT stored in the second FIFO circuits 330 may be output as read data. In some embodiments, instead of the delayed signal WRd, a separate clock may be used to read the read data from the second FIFO circuits 330. However, embodiments are not limited thereto.

As described above, according to some embodiments, FIFO circuits constituting the interface circuit 300 may be implemented in a multi-stage form. An operating frequency of a FIFO circuit (e.g., 330) arranged at a rear stage of the interface circuit 300 may be lower than an operating frequency of a FIFO circuit (e.g., 320) arranged at a front stage thereof. A capacity or a depth of the FIFO circuit (e.g., 330) arranged at the rear stage of the interface circuit 300 may be greater or deeper than a capacity or a depth of the FIFO circuit (e.g., 320) arranged at a front stage thereof. As a result, the power consumption of the interface circuit 300 may be reduced.

Figure 10:
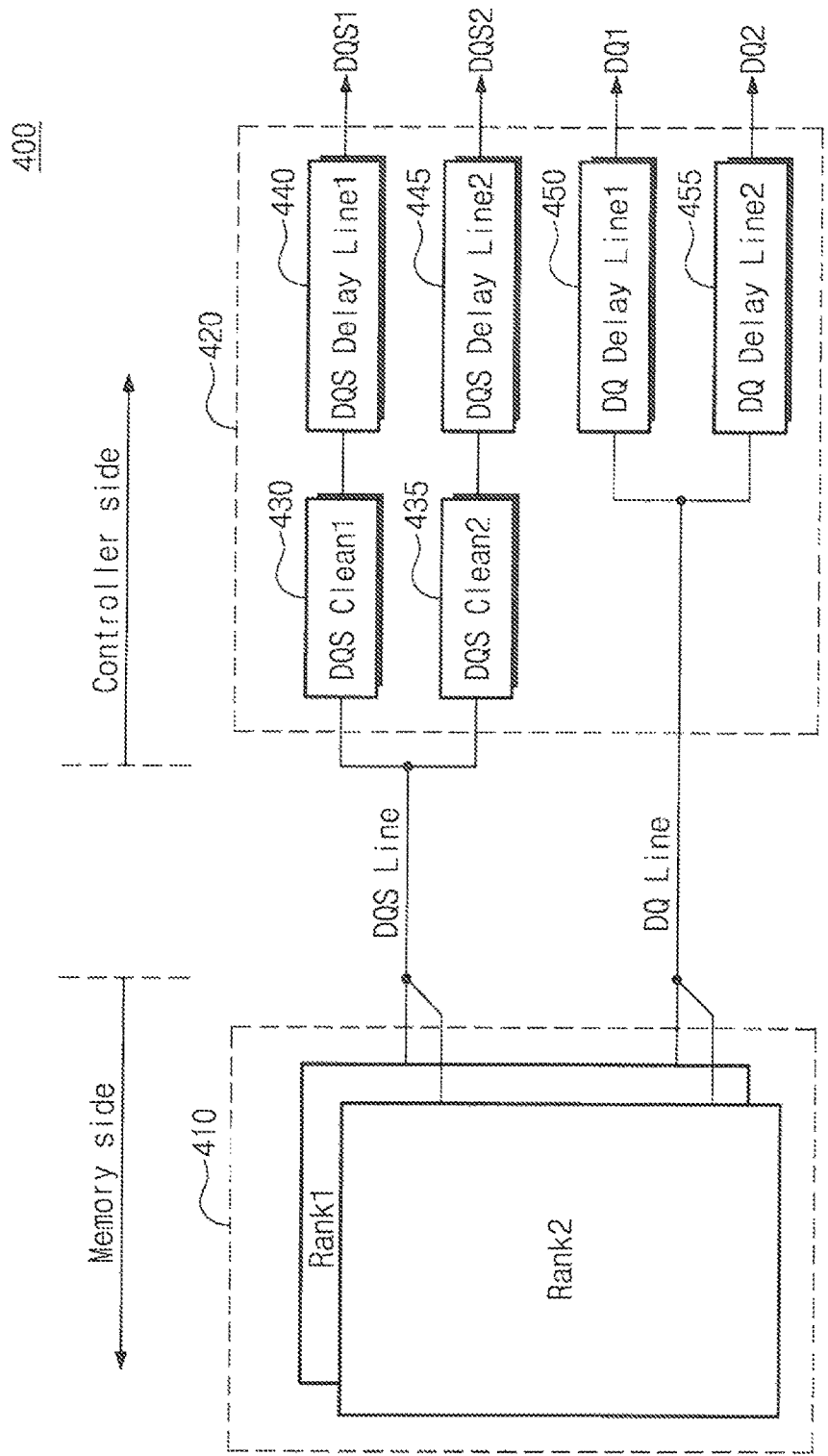
FIG. 10 is a block diagram schematically illustrating a memory device according to some embodiments of the inventive concepts according to some embodiments of the inventive concepts.
Figure 11:
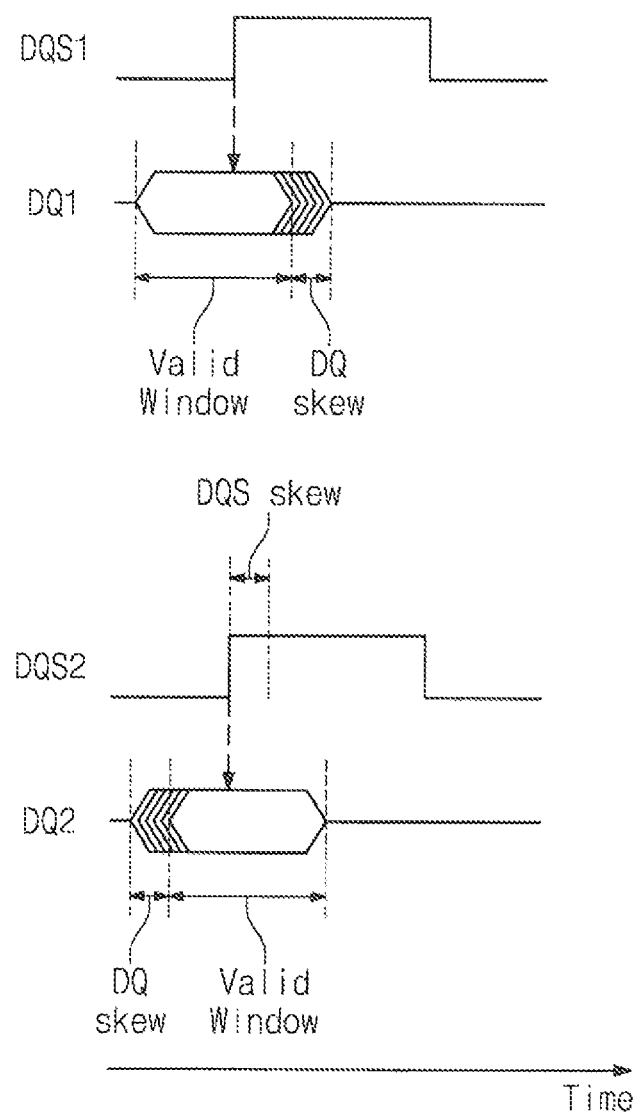
FIG. 11 is a timing diagram illustrating an operation of the interface circuit illustrated in FIG. 10 according to some embodiments of the inventive concepts.

FIG. 10 is a block diagram schematically illustrating a memory device according to some embodiments of the inventive concepts. FIG. 11 is a timing diagram illustrating an operation of the interface circuit illustrated in FIG. 10 according to some embodiments of the inventive concepts. An operation of an interface circuit 420 will be described with reference to FIGS. 10 and 11.

A memory device 400 may include a memory 410 and the interface circuit 420. As illustrated in FIG. 10, the memory 410 and the interface circuit 420 may be connected to each other through a data strobe (DQS) line and a data (DQ) line. For example, data strobe signals DQS1 and DQS2 may be provided from the memory 410 to the interface circuit 420 through the DQS line. For example, data signals DQ1 and DQ2 may be provided from the memory 410 to the interface circuit 420 through the DQ line. Although only one data line is illustrated in FIG. 10, the number of data lines may be determined according to a rule of a DDR specification.

The memory 410 may be implemented with a multi-rank structure. A first data strobe signal DQS1 and a first data signal DQ1 from a first rank Rank1 may be received through the DQS line and the DQ line, respectively. A second data strobe signal DQS2 and a second data signal DQ2 from a second rank Rank2 may be received through the DQS line and the DQ line, respectively. In some embodiments, the memory 410 may be illustrated as being implemented with two ranks. However, the number of ranks may not be limited thereto. A configuration of each of the ranks constituting the memory 410 may be substantially the same as or similar to the memory 120 described with reference to FIG. 1, and a duplicated description may be thus omitted.

The interface circuit 420 may include a first DQS clean circuit 430, a second DQS clean circuit 435, a first DQS delay line 440, a second DQS delay line 445, a first DQ delay line 450, and a second DQ delay line 455. An identification signal indicating which rank outputs a data signal and a data strobe signal may be separately received from each rank. The interface circuit 420 may drive any one of the first DQS clean circuit 430 and the second DQS clean circuit 435 in response to the identification signal. The first DQS delay line 440 and the second DQS delay line 445, and the first DQ delay line 450 and the second DQ delay line 455 may be driven in the same manner as that described above.

The first DQS clean circuit 430 may clean the first data strobe signal DQS1 received from the first rank Rank1. For example, when the first data strobe signal DQS1 is received from the first rank Rank1, noise or distortion may be generated in a preamble of the first data strobe signal DQS1. The first DQS clean circuit 430 may generate the clean first data strobe signal DQS1 by removing the noise or distortion from the first data strobe signal DQS1.

The second DQS clean circuit 435 may clean the second data strobe signal DQS2 received from the second rank Rank2. A configuration and an operation of the second DQS clean circuit 435 may be substantially the same as or similar to those of the first DQS clean circuit 430, and a detailed description thereof may be thus omitted.

The first DQS delay line 440 may delay the first data strobe signal DQS1 such that the first data strobe signal DQS1 is arranged at or near the center of a valid window of the first data signal DQ1. That is, the first DQS delay line 440 may calibrate the skew of the first data strobe signal DQS1.

The second DQS delay line 445 may delay the second data strobe signal DQS2 such that the second data strobe signal DQS2 is arranged at or near the center of a valid window of the second data signal DQ2. That is, the second DQS delay line 445 may calibrate the skew of the second data strobe signal DQS2.

In some embodiments, only the skew of the second data strobe signal DQS2 may be calibrated. However, embodiments are not limited thereto. That is, if data is read from a plurality of ranks, the skews of the first and second data strobe signals DQS1 and DQS2 may be all calibrated to provide an optimum valid window.

The first DQ delay line 450 and the second DQ delay line 455 may calibrate the skew of the first data signal DQ1 and the skew of the second data signal DQ2, respectively. There may be a difference between read paths of the first and second data signals DQ1 and DQ2 because the first and second data signals DQ1 and DQ2 may be respectively read from different ranks.

The signals DQS1, DQS2, DQ1, and DQ2, the skews of which are calibrated, may be output from the interface circuit through samplers (or sampling circuits) and multi-stage FIFO circuits according to some embodiments of the inventive concepts. This will be more fully described with reference to FIG. 12.

Figure 12:
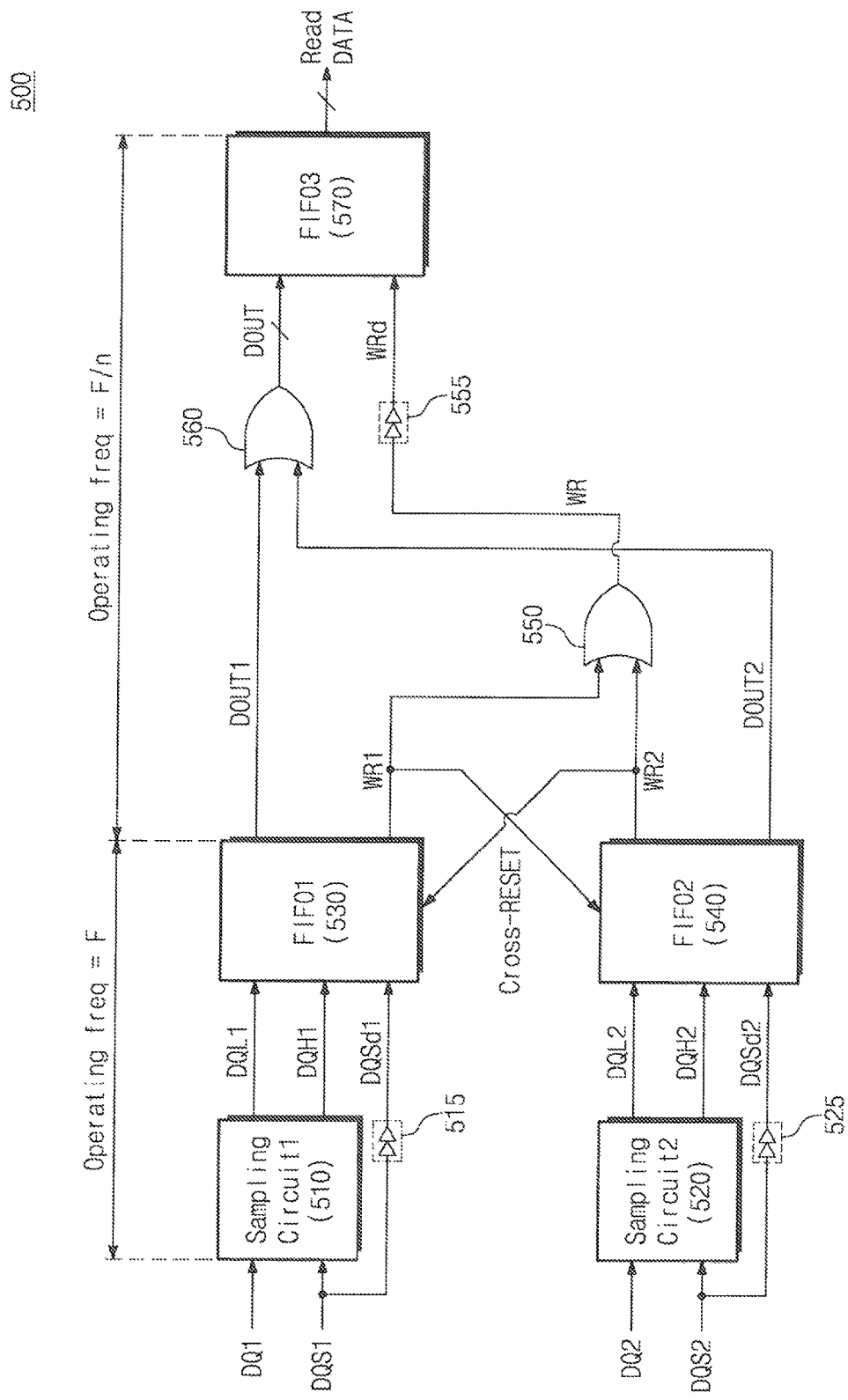
FIG. 12 is a block diagram schematically illustrating an interface circuit according to some embodiments of the inventive concepts.
Figure 13:
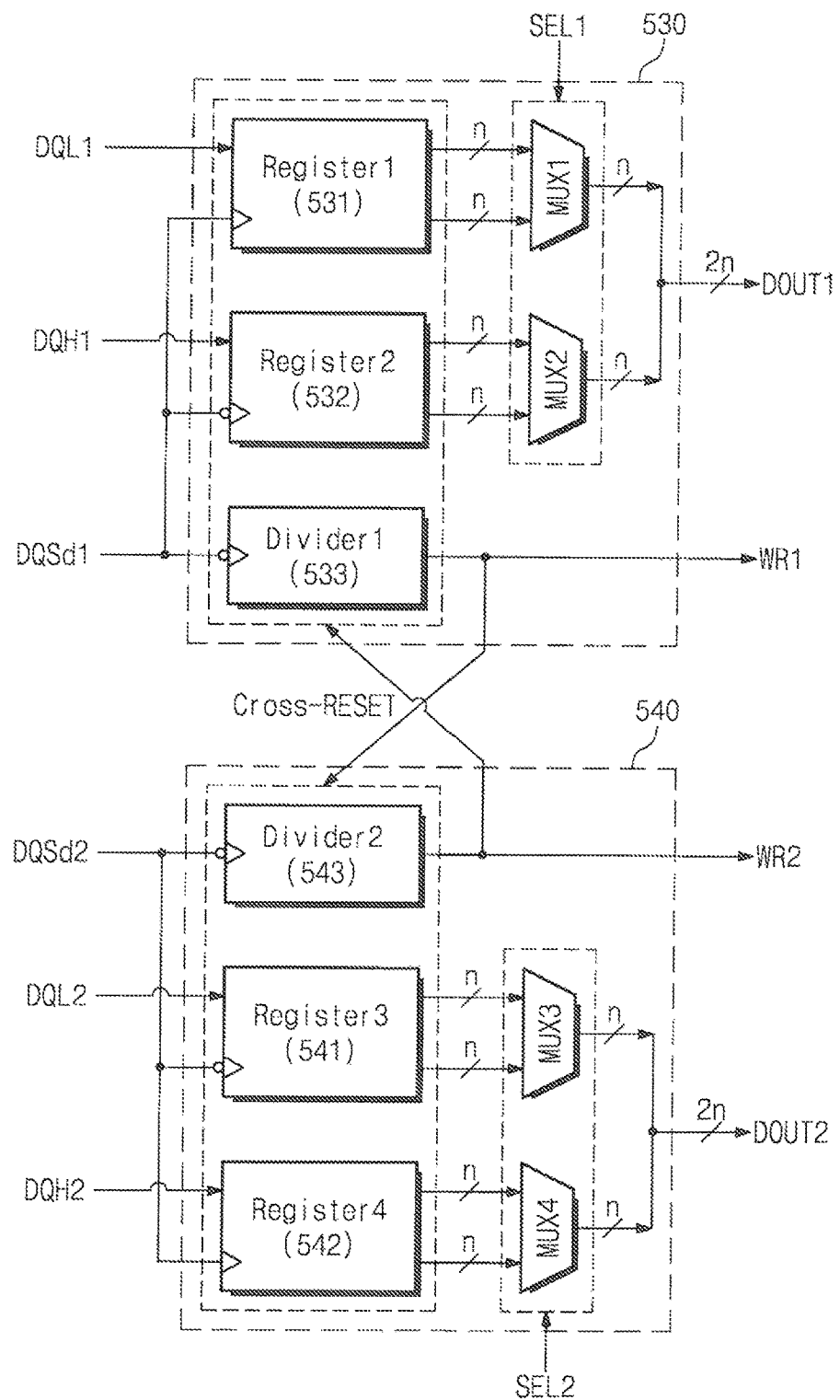
FIG. 13 is a block diagram schematically illustrating an exemplary configuration of the first and second FIFO circuits illustrated in FIG. 12 according to some embodiments of the inventive concepts.
Figure 14:
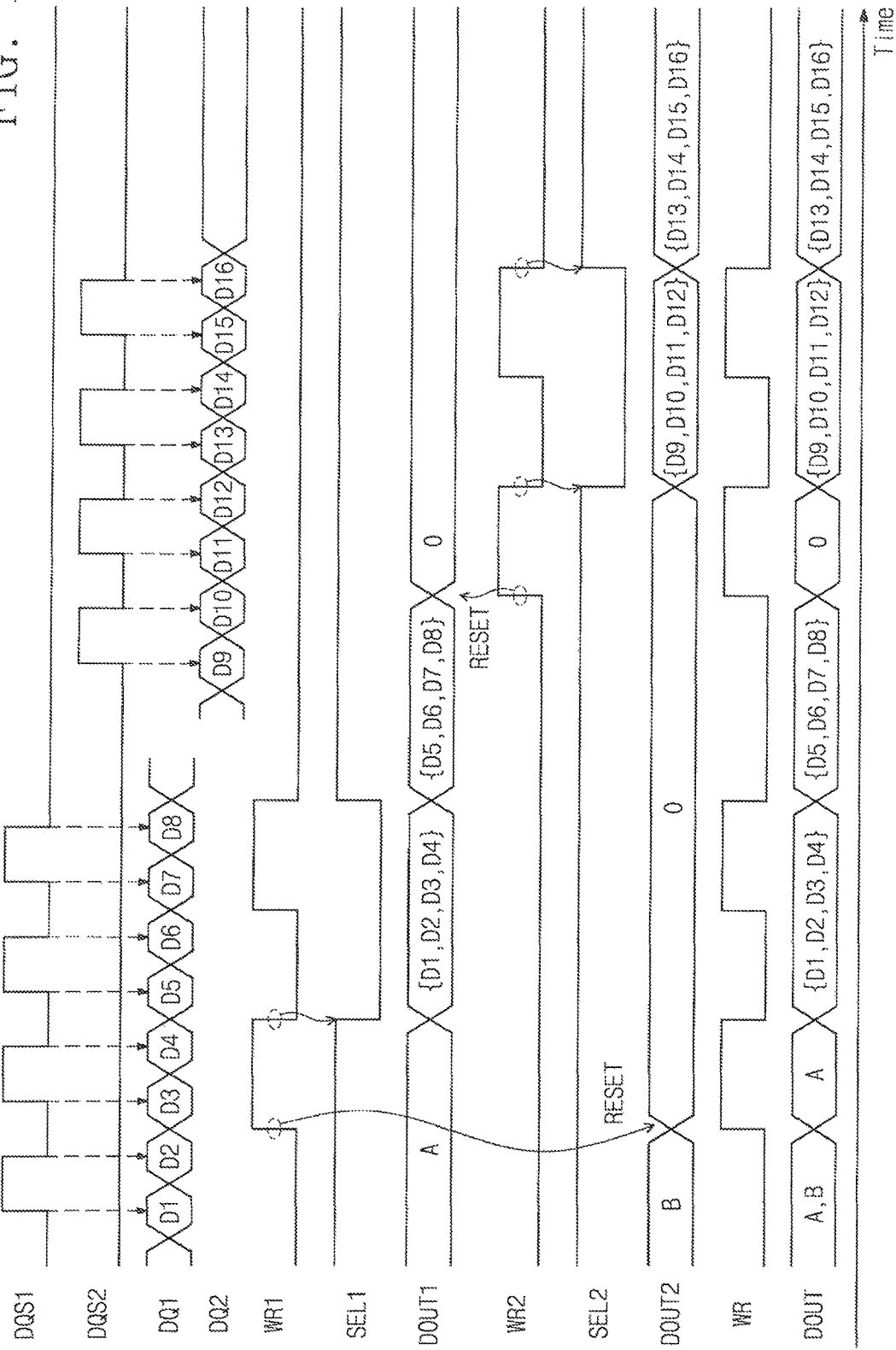
FIG. 14 is a timing diagram illustrating an operation of the interface circuit illustrated in FIG. 12 according to some embodiments of the inventive concepts.

FIG. 12 is a block diagram schematically illustrating an interface circuit according to some embodiments of the inventive concepts. FIG. 13 is a block diagram schematically illustrating an exemplary configuration of the first and second FIFO circuits illustrated in FIG. 12 according to some embodiments of the inventive concepts. FIG. 14 is a timing diagram illustrating an operation of the interface circuit illustrated in FIG. 12 according to some embodiments of the inventive concepts. For example, an interface circuit 500 illustrated in FIG. 12 may be used to process data signals DQ from a multi-rank memory described with reference to FIG. 10.

Referring to FIG. 12, the interface circuit 500 may include a first sampling circuit 510, a second sampling circuit 520, a first FIFO circuit 530, a second FIFO circuit 540, a first OR gate 550, a second OR gate 560, and a third FIFO circuit 570. The interface circuit 500 may further include a first delay chain 515 that delays the first data strobe signal DQS1, a second delay chain 525 that delays the second data strobe signal DQS2, and a third delay chain 555 that delays the signal WR output from the first OR gate 550.

An operation of the first sampling circuit 510 will be described with reference to FIGS. 12 and 14. The first sampling circuit 510 may receive the first data strobe signal DQS1 and the first data signal DQ1 from the first DQS delay line 440 (refer to FIG. 10) and the first DQ delay line 450 (refer to FIG. 10), respectively. The first sampling circuit 510 may latch the first data signal DQ1 in response to the first data strobe signal DQS1. To this end, the first sampling circuit 510 may have a configuration that is the same as or similar to that of the sampling circuit 210 illustrated in FIG. 3.

The first sampling circuit 510 may generate first read data DQL1 by latching the first data signal DQ1 at first edges (e.g., rising edges) of the first data strobe signal DQS1, respectively. The first read data DQL1 may include odd-numbered pieces of data among pieces of data constituting the first data signal DQ1. The first sampling circuit 510 may generate second read data DQH1 by latching the first data signal DQ1 at second edges (e.g., falling edges) of the first data strobe signal DQS1, respectively. The second read data DQH1 may include even-numbered pieces of data among the pieces of data constituting the first data signal DQ1.

The second sampling circuit 520 may receive the second data strobe signal DQS2 and the second data signal DQ2 from the second DQS delay line 445 (refer to FIG. 10) and the second DQ delay line 455 (refer to FIG. 10), respectively. The second sampling circuit 520 may latch the second data signal DQ2 in response to the second data strobe signal DQS2. A configuration and an operation of the second sampling circuit 520 may be substantially the same as or similar to those of the sampling circuit 210 of FIG. 3 or the first sampling circuit 510, and a detailed description thereof may be thus omitted.

The first delay chain 515 may generate a delayed first data strobe signal DQSd1 by delaying the first data strobe signal DQS1. The second delay chain 525 may generate a delayed second data strobe signal DQSd2 by delaying the second data strobe signal DQS2.

Operations of the first FIFO circuit 530 and the second FIFO circuit 540 will be more fully described with reference to FIGS. 12, 13, and 14.

The first FIFO circuit 530 may include a first register 531, a second register 532, a first divider 533, a first multiplexer MUX1, and a second multiplexer MUX2. In some embodiments, the first FIFO circuit 530 may further include the select signal generator 224 that may be the same as or similar to that illustrated in FIG. 5.

The first register 531 may store the first read data DQL1 by using the delayed first data strobe signal DQSd1. For example, the first register 531 may latch the first read data DQL1 at a first edge (e.g., rising edge) of the delayed first data strobe signal DQSd1. As a result, as in that described in FIG. 6, parallel data D1, D3, D5, and D7 may be stored in the first register 531.

As in the first register 531, the second register 532 may latch the second read data DQH1 at a second edge (e.g., falling edge) of the delayed first data strobe signal DQSd1. As a result, as in that described in FIG. 7, parallel data D2, D4, D6, and D8 may be stored in the second register 532.

The parallel data D1, D3, D5, and D7 stored in the first register 531 may be classified into groups each including "n" parallel data. Here, "n" is a division ratio of the first divider 533 (i.e., a value obtained by dividing a frequency of the delayed first data strobe signal DQSd1 by a frequency of the signal WR). For example, if "n" is "2", the parallel data D1 and D3 may be provided to the first multiplexer MUX1 before the parallel data D5 and D7 is provided to the first multiplexer MUX1.

As in that described above, the parallel data D2, D4, D6, and D8 stored in the second register 532 may be classified into groups each including "n" parallel data. For example, if "n" is "2", the parallel data D2 and D4 may be provided to the second multiplexer MUX2 before the parallel data D6 and D8 is provided to the second multiplexer MUX2.

The second FIFO circuit 540 may be initialized (or reset) before selection operations of the first and second multiplexers MUX1 and MUX2. For example, the second FIFO circuit 540 may be initialized (or reset) by a signal WR1 that is generated as a division result of the first divider 533. As the initialization operation is performed on the second FIFO circuit 540, an output of the second FIFO circuit 540 may not have an influence on the first FIFO circuit 530 before at least new data is input to the second FIFO circuit 540. Data "B" that is output as data DOUT2 before the second FIFO circuit 540 is initialized may indicate random data that is previously stored in the second FIFO circuit 540.

The first multiplexer MUX1 may select any one of two groups of received parallel data in response to a first select signal SEL1. The second multiplexer MUX2 may select any one of two groups of received parallel data in response to the first select signal SEL1. As illustrated in FIG. 14, the first select signal SEL1 may be generated based on the signal WR1 that is generated as a division result of the first divider 533. In some embodiments, a waveform of the first select signal SEL1 may be as illustrated when "n" is "2". However, a time period between a rising edge and a falling edge of the first select signal SEL1 may be variable according to a value of "n".

The first multiplexer MUX1 may select parallel data D1 and D3 in response to the falling edge of the first select signal SEL1. The second multiplexer MUX2 may select parallel data D2 and D4 in response to the falling edge of the first select signal SEL1. The parallel data D1, D2, D3, and D4 selected by the first and second multiplexers MUX1 and MUX2 may be output as first output data DOUT1. That is, the output data DOUT1 may be output in units of "2n" bits. Data "A" that is output before the first output data DOUT1 is output may indicate random data that is previously stored in the first FIFO circuit 530.

Afterwards, the first multiplexer MUX1 may select parallel data D5 and D7 in response to the rising edge of the first select signal SEL1. The second multiplexer MUX2 may select parallel data D6 and D8 in response to the rising edge of the first select signal SEL1. The parallel data D5, D6, D7, and D8 selected by the first and second multiplexers MUX1 and MUX2 may be output as first output data DOUT1. That is, the output data DOUT1 may be output in units of 2n bits.

After the first output data DOUT1 is output, the first FIFO circuit 530 may be initialized. For example, the first FIFO circuit 530 may be initialized (or reset) by a signal WR2 that is generated as a division result of a second divider 543. As the initialization operation is performed on the first FIFO circuit 530, an output of the first FIFO circuit 530 may not have an influence on the second FIFO circuit 540 before at least new data is input to the first FIFO circuit 530.

The second FIFO circuit 540 may include a third register 541, a fourth register 542, the second divider 543, a third multiplexer MUX3, and a fourth multiplexer MUX4. In some embodiments, the second FIFO circuit 540 may further include a select signal generator 224 that may be the same as or similar to that illustrated in FIG. 5.

Operations of the third register 541, the fourth register 542, the second divider 543, the third multiplexer MUX3, and the fourth multiplexer MUX4 may be substantially the same as or similar to those of the first register 531, the second register 532, the first divider 533, the first multiplexer MUX1, and the second multiplexer MUX2 described above. However, parallel data D9, D10, D11, and D12 may be output as second output data DOUT2 at a falling edge of a second select signal SEL2, and parallel data D13, D14, D15, and D16 may be output as second output data DOUT2 at a rising edge of the second select signal SEL2.

The first OR gate 550 may output a signal WR by performing an OR operation on the signals WR1 and WR2. The signal WR may have 1/n times a frequency of the data strobe signal DQS1 or DQS2. The signal WR may be provided to the third FIFO circuit 570 as delayed signal WRd after being delayed by the third delay chain 555.

The second OR gate 560 may perform an OR operation on the first output data DOUT1 and the second output data DOUT2. An output of the second OR gate 560, that is, output data DOUT may be provided to the third FIFO circuit 570.

The output data DOUT may be stored in the third FIFO circuit 570 in synchronization with the delayed signal WRd. That is, an operating frequency for storing the output data DOUT in the third FIFO circuit 570 may be "F/n". Read data may be output from the third FIFO circuit 570. To output the read data, various clocks may be used in consideration of various factors such as a specification of the interface circuit 500 and a specification and state of a host.

With the above-described operations of the first FIFO circuit 530 and the second FIFO circuit 540, in some embodiments, the first FIFO circuit 530 may output the first output data DOUT1 by processing data read from the first rank Rank1 of the memory 410 (refer to FIG. 10). The second FIFO circuit 540 may output the second output data DOUT2 by processing data read from the second rank Rank2 of the memory 410. However, the second FIFO circuit 540 may be reset by the signal WR1 from the first divider 533 before the first output data DOUT1 is output. Also, the first FIFO circuit 530 may be reset by the signal WR2 from the second divider 543 before the second output data DOUT2 is output.

With the above-described cross-reset operation, data outputs of the first FIFO circuit 530 and the second FIFO circuit 540 may not have an influence on each other. That is, pieces of data that are read from different ranks may be correctly output from an interface circuit. The multi-stage FIFO circuits may be configured such that a rear-stage FIFO circuit operates at a relatively low operating frequency, and thus power consumption of the interface circuit may be reduced. In addition, a FIFO circuit (e.g., the third FIFO circuit 570) may be shared upon processing of pieces of data from different ranks, and thus a chip size may be reduced.

Figure 15:
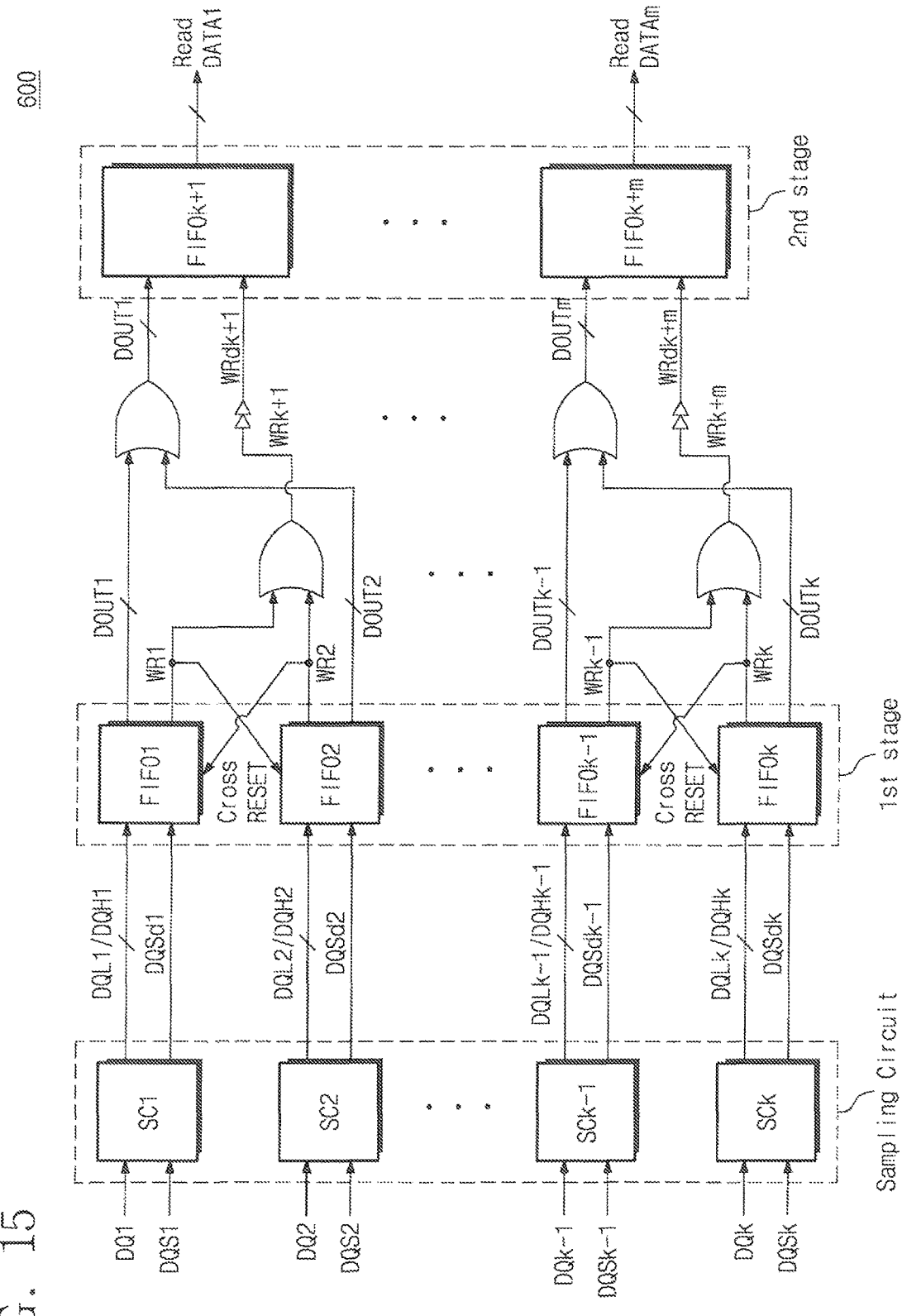
FIG. 15 is a block diagram schematically illustrating an interface circuit according to some embodiments of the inventive concepts.

FIG. 15 is a block diagram schematically illustrating an interface circuit according to some embodiments of the inventive concepts. Referring to FIG. 15, an interface circuit 600 may include a plurality of sampling circuits SC1 to SCk, a first stage including a plurality of FIFO circuits FIFO1 to FIFOk, and a second stage including a plurality of FIFO circuits FIFOk+1 to FIFOk+m. The interface circuit 600 may further include OR gates that may be configured to transfer a result of a cross-reset operation executed between two adjacent FIFO circuits among the FIFO circuits FIFO1 to FIFOk of the first stage to the second stage.

In FIG. 15, basic operations of the sampling circuits SC1 to SCk and the FIFO circuits FIFO1 to FIFOk and FIFOk+1 to FIFOk+m, the cross-reset operation executed between two adjacent FIFO circuits of the first stage, and operations of the OR gates may be substantially the same as or similar to those described with reference to FIGS. 1 to 14, and thus detailed descriptions thereof may not be repeated here. For ease of illustration, some components (e.g., delay chains) are not illustrated in FIG. 15. The FIFO circuits FIFO1 to FIFOk and FIFOk+1 to FIFOk+m are illustrated in FIG. 15 as being implemented in a 2-stage form. However, according to some embodiments, the FIFO circuits FIFO1 to FIFOk and FIFOk+1 to FIFOk+m may be implemented in an n-stage form (n being an integer of 3 or more).

According to some embodiments, the interface circuit 600 may include FIFO circuits implemented in a multi-stage form. An operating frequency of the FIFO circuits FIFO1 to FIFOk (that is, the first stage) arranged at the front stage of the interface circuit 600 may be the same as or similar to an operating frequency of data strobe signals DQS1 to DQSk received from a memory. In contrast, an operating frequency of the FIFO circuits FIFOk+1 to FIFOk+m (that is, the second stage) arranged at the rear stage of the interface circuit 600 may be lower than the operating frequency of the FIFO circuits FIFO1 to FIFOk of the first stage. A capacity of each of the FIFO circuits FIFOk+1 to FIFOk+m of the second stage may be greater than a capacity of each of the FIFO circuits FIFO1 to FIFOk of the first stage. With the above-described configuration, power consumption of the interface circuit 600 may be reduced by reducing power consumption of the second stage that occupies a considerable portion of power consumption of the interface circuit 600.

According to some embodiments, an interface circuit may include multi-stage FIFO circuits. The interface circuit may be configured such that FIFO circuits arranged at the rear of the multi-stage FIFO circuits operates at a low operating frequency, and thus power consumption of the interface circuit may be reduced.

While the inventive concepts have been described with reference to some embodiments, it will be apparent to those skilled in the art that various changes and modifications may be made without departing from the spirit and scope of the inventive concepts. Therefore, it should be understood that the above described embodiments are not limiting, but illustrative.

What is claimed is:

1. An interface circuit comprising:
   a first FIFO circuit configured to process pieces of first input data in a FIFO manner in response to a first reference signal, configured to generate first output data, and configured to divide the first reference signal to generate a first division signal;
   a second FIFO circuit configured to process pieces of second input data in the FIFO manner in response to a second reference signal, configured to generate second output data, and configured to divide the second reference signal to generate a second division signal; and
   a third FIFO circuit configured to store third input data that is generated based on the first output data and the second output data,
   wherein the first FIFO circuit is configured to be reset by the second division signal before the second output data is output from the second FIFO circuit,
   wherein the second FIFO circuit is configured to be reset by the first division signal before the first output data is output from the first FIFO circuit,
   wherein the first FIFO circuit is configured to operate at a first frequency,
   wherein the second FIFO circuit is configured to operate at a second frequency, and
   wherein the third FIFO circuit is configured to operate at a third frequency that is different from the first frequency.

2. The interface circuit of claim 1, further comprising:
   a first sampling circuit configured to generate the first input data; and
   a second sampling circuit configured to generate the second input data.

3. The interface circuit of claim 1, further comprising:
   a first delay circuit configured to delay a first data strobe signal to generate the first reference signal; and
   a second delay circuit configured to delay a second data strobe signal to generate the second reference signal.

4. The interface circuit of claim 1, wherein the third frequency is lower than the first frequency, and lower than the second frequency.

5. The interface circuit of claim 1, further comprising a first OR gating circuit configured to perform a first OR operation on the first output data and the second output data to generate the third input data, and configured to output the third input data to the third FIFO circuit.

6. The interface circuit of claim 5, further comprising a second OR gating circuit configured to perform a second OR operation on the first division signal and the second division signal to generate a third reference signal.

7. The interface circuit of claim 6, wherein the third FIFO circuit is configured to store the third input data in response to the third reference signal.

8. The interface circuit of claim 1, wherein the first FIFO circuit includes:
a first register configured to generate the pieces of the first input data; and
a first multiplexer configured to select at least one of the pieces of the first input data in response to a first edge of the first reference signal, and to select a remainder of the pieces of the first input data other than the at least one of the pieces of the first input data in response to a second edge of the first reference signal.

9. An interface circuit comprising:
a first FIFO circuit configured to process a first portion of first input data in a FIFO manner in response to a first reference signal, configured to process a second portion of the first input data in the FIFO manner in response to the first reference signal, configured to generate first output data based on the first portion of the first input data and the second portion of the first input data, and configured to divide the first reference signal to generate a first division signal; and
a second FIFO circuit configured to process a first portion of second input data in the FIFO manner in response to a second reference signal, configured to process a second portion of the second input data in the FIFO manner in response to the second reference signal, configured to generate second output data based on the first portion of the second input data and the second portion of the second input data, and configured to divide the second reference signal to generate a second division signal,
wherein the first FIFO circuit is configured to be reset by the second division signal, and
wherein the second FIFO circuit is configured to be reset by the first division signal.

10. The interface circuit of claim 9, further comprising a third FIFO circuit configured to store third input data that is generated based on the first output data and the second output data.

11. The interface circuit of claim 10,
wherein the first FIFO circuit is configured to operate at a first frequency,
wherein the second FIFO circuit is configured to operate at a second frequency, and
wherein the third FIFO circuit is configured to operate at a third frequency that is lower than the first frequency.

12. The interface circuit of claim 9, further comprising:
a first sampling circuit configured to generate the first input data;
a second sampling circuit configured to generate the second input data;
a first delay circuit configured to delay a first data strobe signal to generate the first reference signal; and
a second delay circuit configured to delay a second data strobe signal to generate the second reference signal.

13. The interface circuit of claim 9,
wherein the first FIFO circuit is configured to be reset by the second division signal before the second output data is output from the second FIFO circuit, and
wherein the second FIFO circuit is configured to be reset by the first division signal before the first output data is output from the first FIFO circuit.

14. The interface circuit of claim 9,
wherein the first FIFO circuit includes a first divider configured to divide the first reference signal to generate the first division signal, and
wherein the second FIFO circuit includes a second divider configured to divide the second reference signal to generate the second division signal.

15. The interface circuit of claim 9,
wherein the first FIFO circuit includes a first register configured to process the first portion of the first input data and a second register configured to process the second portion of the first input data, and
wherein the second FIFO circuit includes a third register configured to process the first portion of the second input data and a fourth register configured to process the second portion of the second input data.

16. An interface circuit comprising:
a first sampling circuit configured to generate first input data;
a second sampling circuit configured to generate second input data;
a first delay circuit configured to delay a first data strobe signal to generate a first delayed data strobe signal;
a second delay circuit configured to delay a second data strobe signal to generate a second delayed data strobe signal;
a first FIFO circuit configured to process the first input data in response to the first delayed data strobe signal, and configured to generate first output data;
a second FIFO circuit configured to process the second input data in response to the second delayed data strobe signal, and configured to generate second output data; and
a third FIFO circuit configured to store third input data that is generated based on the first output data and the second output data,
wherein the first FIFO circuit is configured to operate at a first frequency,
wherein the second FIFO circuit is configured to operate at a second frequency, and
wherein the third FIFO circuit is configured to operate at a third frequency that is lower than the first frequency.

17. The interface circuit of claim 16,
wherein the first FIFO circuit is configured to divide the first delayed data strobe signal to generate a first division signal, and
wherein the second FIFO circuit is configured to divide the second delayed data strobe signal to generate a second division signal.

18. The interface circuit of claim 17,
wherein the first FIFO circuit is configured to be reset by the second division signal before the second output data is output from the second FIFO circuit, and
wherein the second FIFO circuit is configured to be reset by the first division signal before the first output data is output from the first FIFO circuit.

19. The interface circuit of claim 17, further comprising:
a first OR gating circuit configured to perform a first OR operation on the first output data and the second output data to generate the third input data; and
a second OR gating circuit configured to perform a second OR operation on the first division signal and the second division signal to generate a third reference signal, wherein the third FIFO circuit is configured to store the third input data in response to the third reference signal.

20. The interface circuit of claim 16,
wherein the first sampling circuit includes a first flip-flop configured to generate a first portion of the first input data and a second flip-flop configured to generate a second portion of the first input data, and
wherein the first FIFO circuit includes a first register configured to process the first portion of the first input data and a second register configured to process the second portion of the first input data.

* * * * *